(12) United States Patent
Anderson et al.

(10) Patent No.: US 12,720,860 B2
(45) Date of Patent: Aug. 25, 2026

(54) VTFET CIRCUIT WITH OPTIMIZED MOL

(71) Applicant: International Business Machines Corporation, Armonk, NY (US)

(72) Inventors: Brent A. Anderson, Jericho, VT (US); Albert M. Chu, Nashua, NH (US); Lawrence A. Clevenger, Saratoga Springs, NY (US); Nicholas Anthony Lanzillo, Wynantskill, NY (US); Ruilong Xie, Niskayuna, NY (US)

(73) Assignee: International Business Machines Corporation, Armonk, NY (US)

(*) Notice: Subject to any disclaimer, the term of this patent is extended or adjusted under 35 U.S.C. 154(b) by 669 days.

(21) Appl. No.: 18/086,229

(22) Filed: Dec. 21, 2022

(65) Prior Publication Data

US 2024/0213252 A1 Jun. 27, 2024

(51) Int. Cl.
*H10D 84/90* (2025.01)
*H03K 17/693* (2006.01)

(52) U.S. Cl.
CPC ......... *H10D 84/907* (2025.01); *H03K 17/693* (2013.01); *H10D 84/953* (2025.01); *H10D 84/975* (2025.01); *H10D 84/985* (2025.01)

(58) Field of Classification Search
CPC .. H10D 84/907; H10D 84/953; H10D 84/975; H10D 84/985; H03K 17/693
See application file for complete search history.

(56) References Cited

U.S. PATENT DOCUMENTS 7,456,447 B2 * 11/2008 Tatsumi ................. H10D 89/10 257/E27.11
10,083,970 B2 9/2018 Pao
10,388,648 B2 8/2019 Balakrishnan
10,418,365 B2 9/2019 Zang
11,043,564 B2 6/2021 Do
(Continued)

FOREIGN PATENT DOCUMENTS

CN 105261629 A 1/2016
WO 2010010865 A1 1/2010
WO 2021165183 A1 8/2021

*Primary Examiner* — Yasser A Abdelaziez
(74) *Attorney, Agent, or Firm* — Scully, Scott, Murphy & Presser, P.C.; Kimberly S. Zillig

(57) ABSTRACT

Integrated circuits and related logic circuits and structures employing VTFET logic devices. In particular, during middle-of-line (MOL) processing, method steps are employed for forming two-level MOL contact connector structures below first (M1) metallization level wiring formed during subsequent BEOL processing. Using damascene and subtractive metal etch techniques, respective MOL contact connector structures at two levels are formed with a second level above a first level contact. These contact connector structures at two levels below M1 metallization level can provide cross-connections to VTFET devices of logic circuits that enable increased scaling of the logic circuit designs, e.g., especially for multiplexor circuit layouts due to wiring access. The flexible MOL cross-connections made below M1 metallization level provides for much improved M1 and M2 wirability and enable semiconductor circuit layouts that allow for improved cell size reduction without creating significant connection issues at high wiring levels thereby increasing circuit design flexibility.

8 Claims, 8 Drawing Sheets

Section Y1

(56) References Cited

U.S. PATENT DOCUMENTS

| | | | | |
|---|---|---|---|---|
| 11,133,412 | B2 | 9/2021 | Do | |
| 11,205,645 | B2 | 12/2021 | Jeong | |
| 2001/0045670 | A1 * | 11/2001 | Nojiri | H10W 20/435 257/E23.152 |
| 2007/0146008 | A1 * | 6/2007 | Tak | H03F 3/45188 257/E21.41 |
| 2015/0370947 | A1 * | 12/2015 | Moroz | H10D 30/6735 716/119 |
| 2017/0244412 | A1 * | 8/2017 | Anderson | H10D 89/10 |
| 2018/0175024 | A1 * | 6/2018 | Do | H10D 84/83 |
| 2018/0197788 | A1 * | 7/2018 | Anderson | H10D 30/63 |
| 2019/0287965 | A1 * | 9/2019 | Cho | H10D 62/114 |
| 2020/0144260 | A1 * | 5/2020 | Do | H10D 84/85 |
| 2020/0295134 | A1 * | 9/2020 | Do | H01L 23/5226 |

* cited by examiner

Section Y1

Section Y2

Section Y3

Section Y4

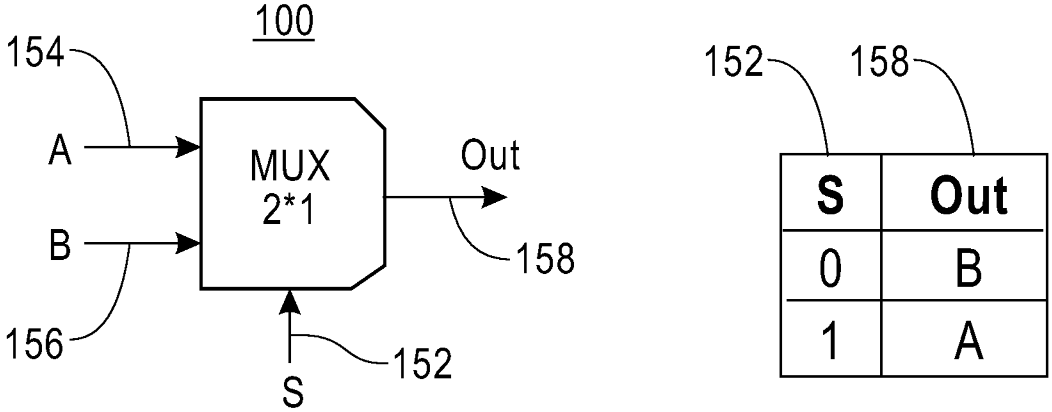
| S | Out |
|---|---|
| 0 | B |
| 1 | A |
FIG. 9A
FIG. 9B
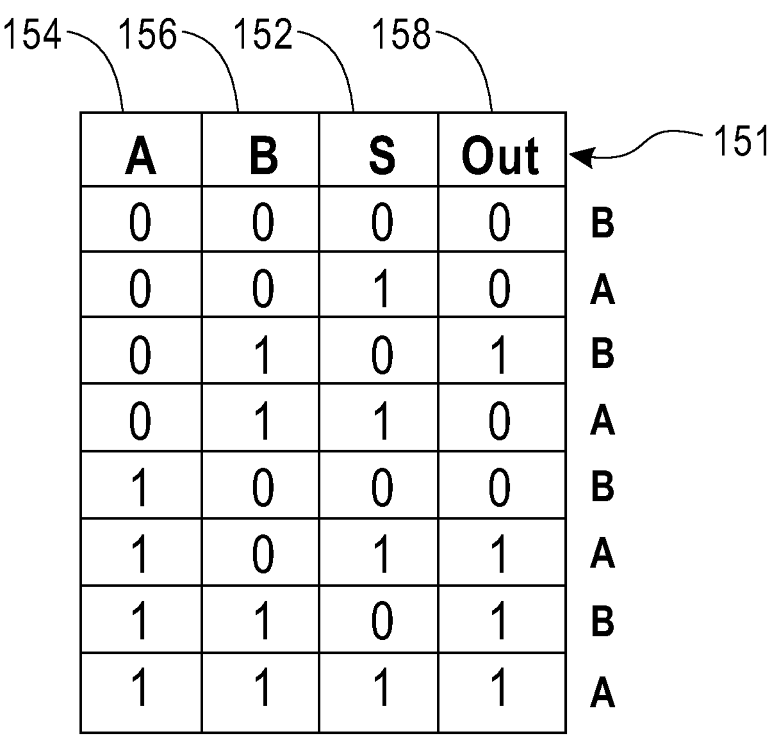
| A | B | S | Out | |
|---|---|---|---|---|
| 0 | 0 | 0 | 0 | B |
| 0 | 0 | 1 | 0 | A |
| 0 | 1 | 0 | 1 | B |
| 0 | 1 | 1 | 0 | A |
| 1 | 0 | 0 | 0 | B |
| 1 | 0 | 1 | 1 | A |
| 1 | 1 | 0 | 1 | B |
| 1 | 1 | 1 | 1 | A |
FIG. 9C

VTFET CIRCUIT WITH OPTIMIZED MOL

FIELD OF THE INVENTION

The present invention generally relates to integrated circuits (ICs) that comprise VTFET (Vertical Transport Field Effect Transistor) devices and circuits comprising the same, and more specifically to methods for increasing Middle-of-Line (MOL) design flexibility by fabricating wiring structures located above the VTFET device in a contact via level below an overlying metal line level.

BACKGROUND OF THE INVENTION

Integrated circuit (IC) designs typically comprise multiple levels of wirings and/or devices that are isolated from one another by an inter-level dielectric (ILD) and are interconnected by multiple metal vias therebetween. The levels at which the wirings and/or devices are located are typically referred to as the "line levels," while the levels at which the metal vias are located are typically referred to as the "via levels."

As IC chips are aggressively scaled, the density of wiring and/or devices at the line levels increases significantly and gradually reaches the maximum density allowed for optimal device performance.

There is a continuing need for further reducing the sizes of the IC chips without adversely affecting the device performance.

SUMMARY OF THE INVENTION

The present invention, in one aspect relates to a system and method for forming semiconductor structures in integrated circuit (IC) devices.

The present invention, in one aspect relates to a system and method for forming semiconductor structures such as circuits using vertical transport FET devices (VTFETs) and methods for improved scaling of the device cell area.

The present invention, in one aspect relates to a system and method for forming semiconductor multiplexor device (MUX) that includes a flexible Middle-of-Line (MOL) structure in the form of a cross-connecting conductor that can be made below the M1 line level for improved cell size reduction (decreasing device footprint).

In one aspect there is provided an IC device. The integrated circuit (IC) device comprises: a logic circuit comprising at least two formed VTFET devices, each VTFET device having corresponding a source region, a drain region, and a gate region; an inter-level dielectric material stack formed above terminals corresponding to each region of the at least two VTFET devices; and a first level conductive contact structure formed at a first level within the inter-level dielectric material stack and having a first end contacting one of: the source region, the drain region, or the gate region of a first VTFET device, the first level conductive contact structure having a second end connecting to one of: a source region, a drain region, or a gate region of a second of the VTFET device of the logic circuit; and a second level conductive contact structure formed at a second level within the inter-level dielectric material stack and the second level conductive contact structure having at least one end contacting the first level conductive contact structure.

In a further embodiment, the second level conductive contact structure and further second level conductive contact structure is formed above the first level conductive contact structure and is electrically isolated therefrom.

In a further aspect, there is provided a semiconductor device. The semiconductor device comprises: a logic circuit including at least at least two formed VTFET devices; an inter-level dielectric material stack formed above the terminals of each the at least the first, second and third formed VTFET devices; one or more lower level conductive contact structures formed at a first level within the inter-level dielectric material stack, a first lower level conductive contact structure electrically contacting a region of a first formed VTFET device of the logic circuit and a second lower level conductive contact structure electrically contacting a region of a second formed VTFET device of the logic circuit; and one or more upper level conductive contact structures formed at a second level within the inter-level dielectric material stack, an upper level conductive contact structure having a first end contacting the first lower level conductive contact structure and having a second end electrically contacting the second lower level conductive contact structure.

In accordance with a further aspect of the present disclosure, there is provided a method of forming an IC device. The method comprises: forming an inter-level dielectric material stack formed above at least two formed VTFET devices; and forming, using damascene process during a MOL process flow, a first level conductive contact structure at a first level within the inter-level dielectric material stack, the first level conductive contact structure contacting a region of a first formed VTFET device of a logic circuit; and forming, using a subtractive etch process during the MOL process flow, a second level conductive contact structure at a second level within the inter-level dielectric material stack, the second level conductive contact structure having a first end contacting the first level conductive contact structure.

Other aspects, features and advantages of the invention will be more fully apparent from the ensuing disclosure and appended claims.

BRIEF DESCRIPTION OF THE DRAWINGS

FIG. 9A depicts a 2-to-1 MUX device corresponding to the MUX circuit structure layout shown in the top-down view of FIG. 2;

FIG. 9B depicts a simplified truth table showing how the logic value of selector signal "S" will output either a signal A or signal B in the MUX circuit of FIG. 9A;

FIG. 9C shows a more detailed truth table corresponding to the 2-to-1 selector MUX of FIG. 9A.

DETAILED DESCRIPTION

Figure 1A:
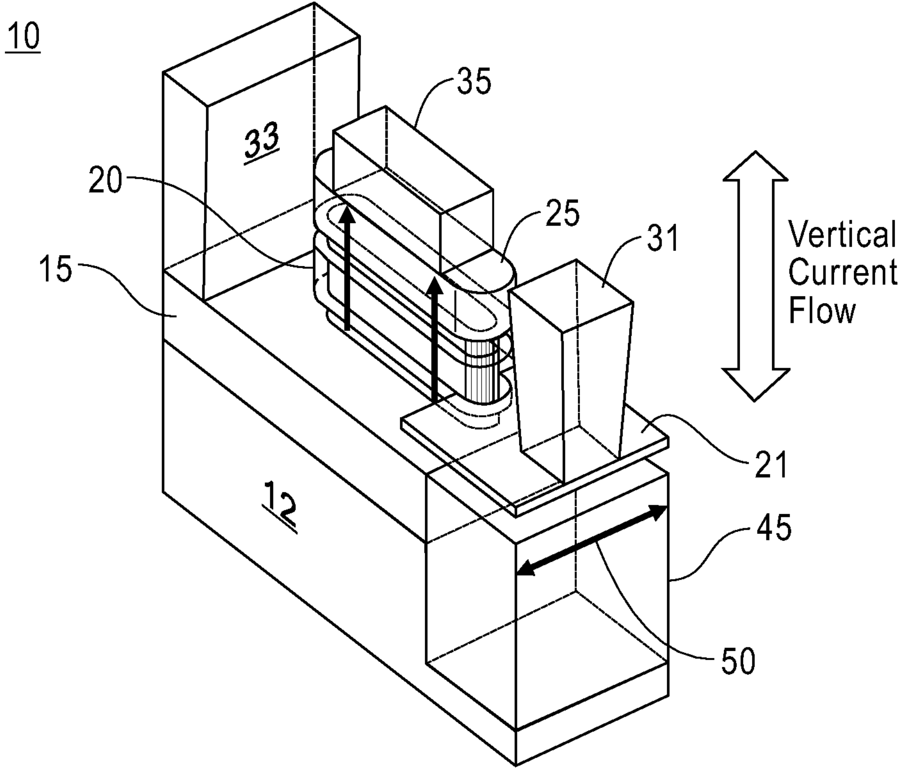
FIG. 1A shows an exemplary three-dimensional (3D) perspective view of a conventional vertical transport field effect transistor (VTFET) semiconductor device structure and FIG. 1B depicts a cross-sectional view of the conventional VTFET semiconductor device structure of FIG. 1A.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1B:
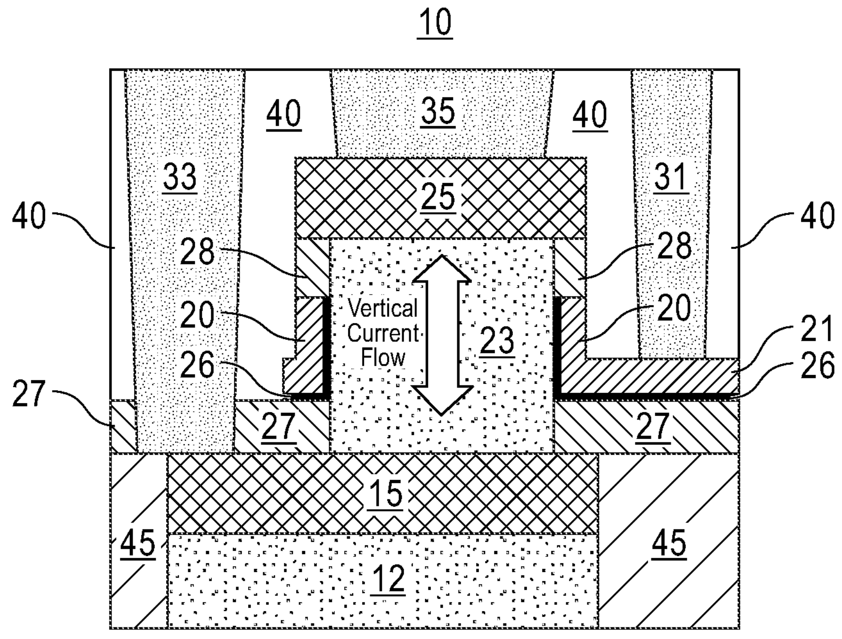

FIG. 1A shows an exemplary 3D perspective view of a conventional Vertical Transport Field Effect Transistor (VTFET) semiconductor device structure 10 and FIG. 1B depicts a cross-sectional view of the conventional VTFET semiconductor device structure 10 of FIG. 1A. As shown in FIG. 1A, the VTFET structure 10 highlights the result of Middle-of-Line (MOL) or Back-End-Of-Line (BEOL) semiconductor manufacturing processes for fabricating conductive wiring, contacts, insulating material layers, metal levels, etc. that interconnect already formed individual devices such as VTFET and associated logic circuitry components formed during Front-End of Line (FEOL) processing. As shown in both FIGS. 1A and 1B, the exemplary VTFET structure 10, includes, from bottom to top: a substrate 12 having formed thereon a semiconductor fin structure formed as a vertical stack composed of a layer forming a bottom source region 15, a vertical oriented nanosheet channel layer 23 electrically connecting the bottom source region 15 and extending vertically for electrical connection to a top layer forming a drain region 25. In an embodiment, the vertical oriented nanosheet channel layer 23 is a two-dimensional (2D) nanostructure with thickness in a scale ranging from 1 to 100 nm. A metal gate structure 20 encapsulates the semiconductor vertical oriented nanosheet channel layer 23 and, in embodiments, the metal gate structure 20 is isolated from the bottom source region 15 and top drain region 25 by respective bottom insulator material spacer 27 and top insulator material spacer 28, respectively. The metal gate structure 20 further includes a gate portion 21 that extends outward above the bottom spacer 28 to enable forming of a metal gate contact structure 31 thereon. In an embodiment, as shown in FIG. 1B, a high-k dielectric material gate dielectric layer 26 is formed around and directly contacting the nanosheet channel of the fin structure, and the metal gate structure 20 surrounds the high-k dielectric material gate dielectric layer 26. As used herein, "high-k" denotes a dielectric material having a dielectric constant (k) that is higher than the dielectric constant of $SiO_2$ at room temperature.

In an embodiment, as shown in FIG. 1B, an inter-layer dielectric (ILD) layer 40 of a low-k dielectric material such as an oxide dielectric material, is formed above the VTFET devices structures, e.g., above the spacer 28, gate portion 21 and top drain region 25 and various metal material contact structures are formed within the ILD layer 40 to electrically contact respective bottom source region 15, top drain region 25 and gate portion 21 of the VTFET. As used herein, "low-k" denotes a dielectric material having a dielectric constant (k) that is equal to the dielectric constant of $SiO_2$ or less. As shown, there is formed a vertical extending bottom metal contact 33 connected to bottom source region 15 and a top drain contact 35 shown connected to top drain region 25. These metal contacts 31, 33 and 35 enable connection with one or more various conductive metal lines at a M1 metal level (not shown) to be fabricated at one or more BEOL processes. As shown in FIG. 1A, 1B, with suitable electrical biasing, the VTFET device 10 enables a current flow vertically through the vertical oriented nanosheet channel layer 23 between source and drain regions. Further shown in FIGS. 1A, 1B are formed adjacent circuit isolation structures, e.g., insulating shallow trench isolation (STI) structures 45, that prevent any electric current leakage between any adjacent semiconductor device component.

As known, by orienting electrical current flow vertically, the gate, spacers and contacts are no longer constrained in traditional ways: i.e., there is room to scale the Contacted Gate Pitch (CGP) 50 representing the physical space where all the components fit while maintaining transistor, contact, and isolation (spacer and shallow trench isolation. STI) size.

Figure 2:
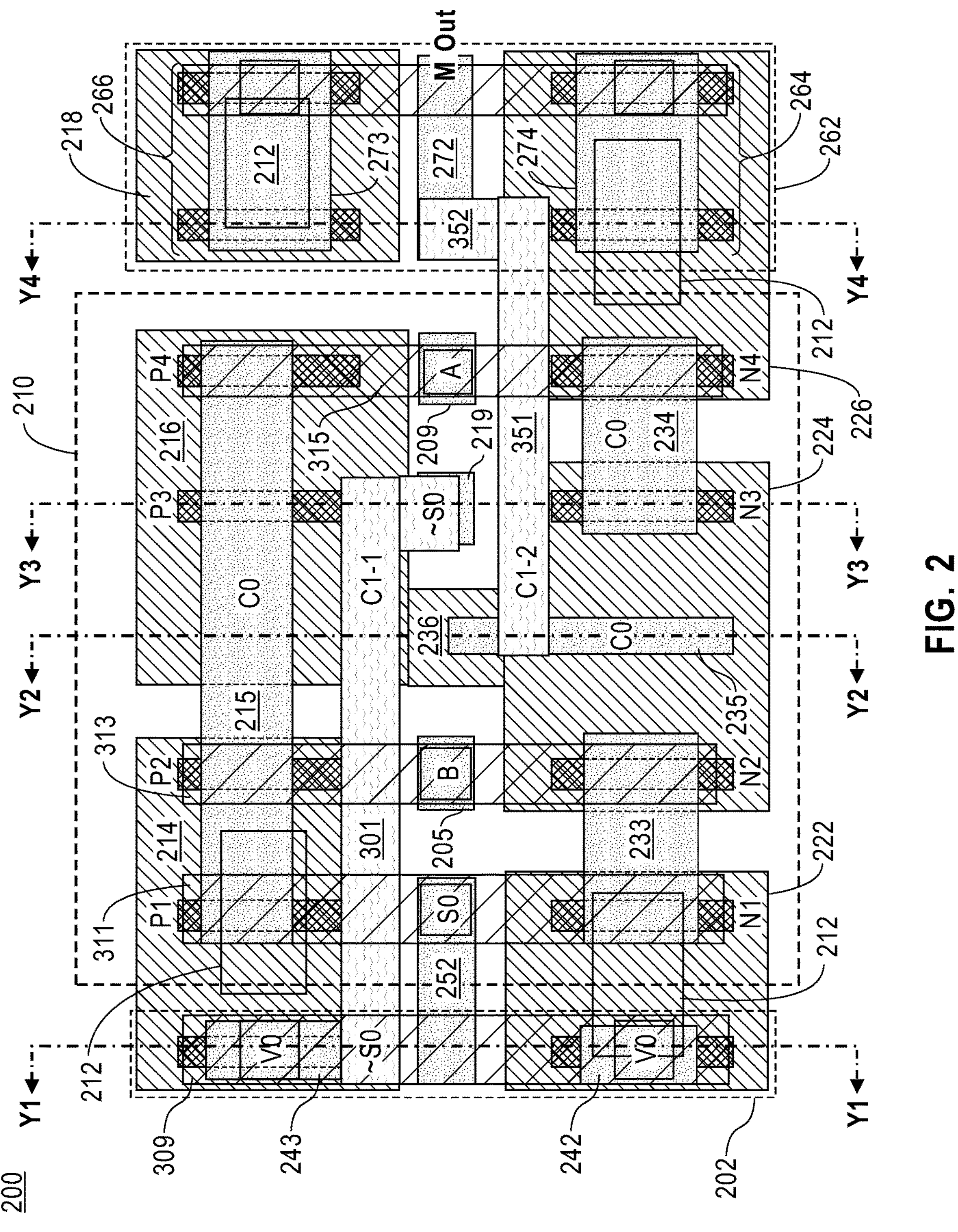
FIG. 2 shows a top down view of a semiconductor multiplexor (MUX) circuit structure layout, the MUX circuit incorporating VTFET devices such as shown in FIGS. 1A, 1B and including additional conductive contact structures for increasing Middle-of-Line (MOL) flexibility in the circuit design according to an aspect of the present invention.

FIG. 2 shows a top down view of a semiconductor MUX circuit structure layout 200, the MUX circuit incorporating several VTFET devices 10 such as shown in FIGS. 1A, 1B and including additional conductive contact structures for increasing MOL flexibility in the circuit design. In a non-limiting embodiment, and for purposes of illustration, FIG. 9A shows a MUX device 100, e.g., a 2-to-1 MUX device 100 that corresponds to the MUX circuit 200 of FIG. 2. MUX device 100 includes a selector input wire "S" 152 for controlling the passing of either a signal 154 at input line A or a signal 156 at input line B to an output signal 158 of the MUX device 100. FIG. 9B depicts a simplified truth table showing how the selector signal "S" 152 at a first logic value "0" will output signal at 158 the signal at B and when selector signal "S" is at a second logic value "1" will output the signal at A. A more detailed truth table 151 for the 2-to-1 selector MUX device 100 of FIG. 9A is shown in FIG. 9C where output signal at 158 will change according to the specific logic values at "A" input 154, "B" input 156 and selector "S" input 152.

Figure 9D:
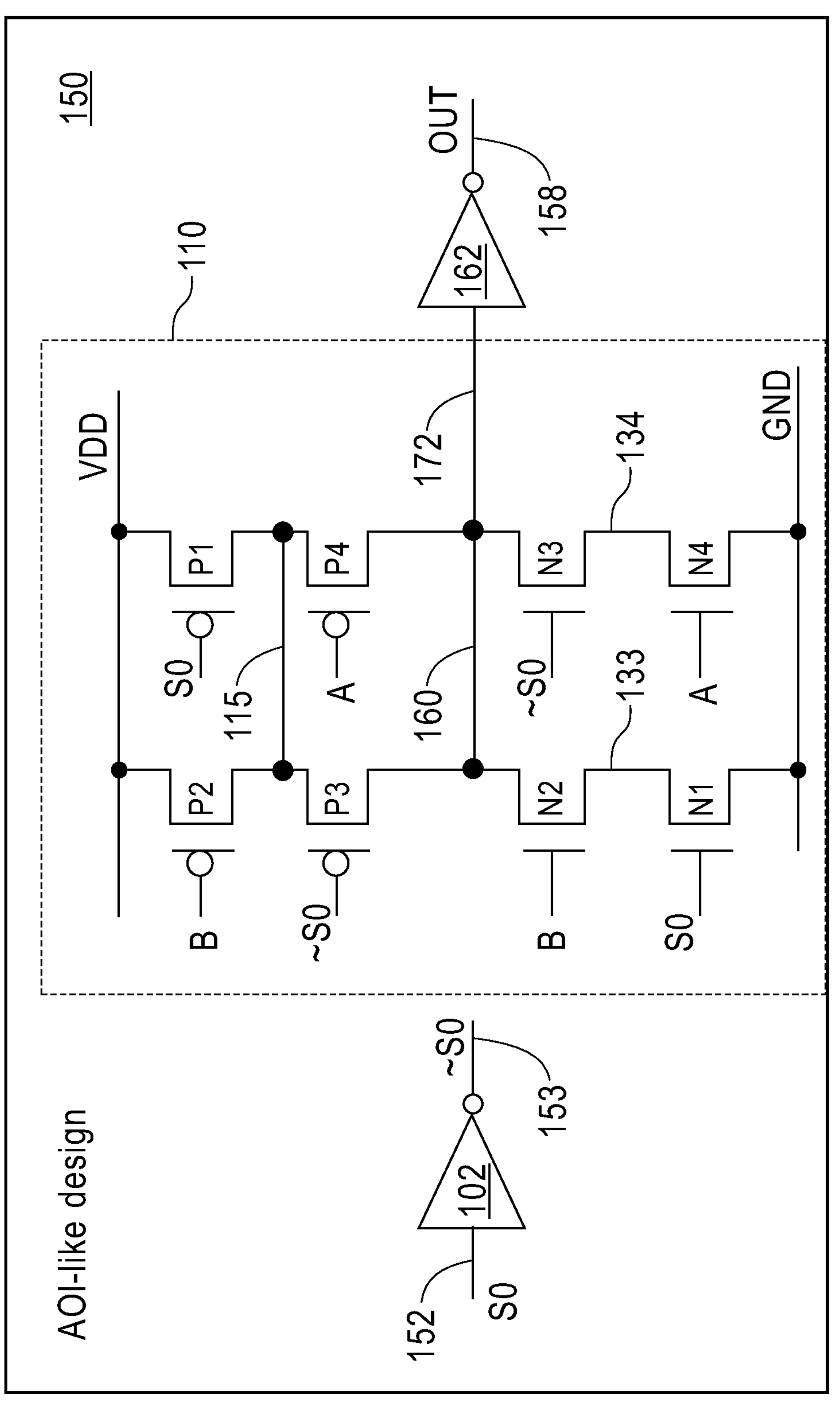
FIG. 9D illustrates an electrical circuit diagram corresponding to the semiconductor MUX circuit structure layout of FIG. 2.

FIG. 9D shows the electrical circuit diagram 150 corresponding to the exemplary 2-to-1 selector MUX device 100 of FIG. 9A. As shown in FIG. 9D, the MUX circuit diagram 150 includes a circuit configuration 110 of connected p-channel type VTFET devices labeled P1, P2, P3 and P4 and n-channel type VTFET devices labeled N1, N2, N3 and N4. An input inverter device 102 receives the selector signal $S_0$ 152 and inverts it to produce an inverted selector signal ~$S_0$ 153. Selector signal $S_0$ 152 is input to the gate terminal of p-channel type VTFET device labeled P1 and is also input to the gate terminal of n-channel type VTFET device labeled N1 for controlling respective transistors P1 and N1. The inverted selector signal ~$S_0$ 153 is input to the gate terminal of p-channel type VTFET device labeled P3 and is also input to the gate terminal of n-channel type VTFET device labeled N3 for controlling respective transistors P3 and N3. As further shown in FIG. 9D, the input MUX signal 154 A is input to both the gate terminal of p-channel type VTFET device labeled P4 and is also input to the gate terminal of n-channel type VTFET device labeled N4 while the input MUX signal B 156 is input to both the gate terminal of p-channel type VTFET device labeled P2 and is also input to the gate terminal of n-channel type VTFET device labeled N2. As shown in FIG. 9D, the drain terminals of p-channel type VTFET devices P1 and P2 are connected to a positive supply rail, e.g., VDD and the respective source terminals of p-channel type VTFET devices P1 and P2 are connected together via a conductor 115. The source terminals of p-channel type VTFET devices P1 and P2 are additionally connected to respective drain terminals of p-channel type VTFET devices P3 and P4. The respective source terminals of p-channel type VTFET devices P3 and P4 are connected together by a connective conductor 160. Further, the source terminals of the n-channel type VTFET devices N1 and N4 are connected to a reference or ground potential, e.g., GND, and the respective drain terminals of n-channel type VTFET devices N1 and N4 are connected to respective source terminals of respective n-channel type VTFET devices N2 and N3. The drain terminals of respective n-channel type VTFET devices N2 and N3 are connected together and are connected to the respective source terminals of respective p-channel type VTFET devices P3 and P4. The connective conductor 160 that electrically connects the drain terminals of respective n-channel type VTFET devices N2 and N3 to the respective source terminals of p-channel type VTFET devices P3 and P4, further is electrically connected to an output buffer or output inverter 162 to provide the output signal 158.

FIG. 2 shows a top-down circuit layout 200 of the MUX circuit diagram 150 of FIG. 9D. In the top down view of circuit layout 200 shown in FIG. 2, there is shown a backside power supply connections 212 to the various VTFET components. The input inverter device 102 of FIG. 9D is shown as a corresponding device structure 202 in FIG. 2 and further in the top down view of circuit 200 shown in FIG. 2, the output inverter 162 of FIG. 9D is shown as a corresponding device structure 202. The device structure 202 corresponding to inverter device 102 includes a formed input conductor 252 for receiving the input selector signal So and inverting it to provide inverse MUX selector signal ~$S_0$ for output on a formed output conductor structure 243. Further, in the top down view of circuit 200 shown in FIG. 2, the MUX circuit configuration 110 of connected p-channel type VTFET devices P1, P2, P3 and P4 and n-channel type VTFET devices N1, N2, N3 and N4 of FIG. 9D is shown as corresponding interconnected MUX device structures 210 in FIG. 2 including top-down views of the individual connected VTFET devices labeled P1, P2, P3 and P4 and N1, N2, N3 and N4. Included in these structures are formed bottom source (or bottom drain) region 214 of VTFET devices P1, P2 and formed bottom source (or bottom drain) region 216 of VTFET devices P3, P4. Similarly, included in these structures are formed bottom source (or bottom drain) region 222 of VTFET device N1, formed bottom source (or bottom drain) region 224 of VTFET devices N2, N3, and formed bottom source (or bottom drain) region 226 of VTFET device N4. As shown in FIG. 2, bottom source (or bottom drain) region 226 extends to form bottom source (or bottom drain) region of a pair of VTFET devices 264 of the output inverter circuit structure 262. Similarly formed is a further bottom source (or bottom drain) region 226 of a further pair of VTFET devices 266 of the output inverter circuit structure 262.

As further shown in FIG. 2, top metal conductor wire 309, 311, 313, 315 provide connection to outside the cell and particularly are the input and output connections to the cell for $S_0$, A, B, and M Out signals, e.g., the MUX selector signal $S_0$ is received via a conductor into the cell from a higher metal level outside the cell and then connects to a second metal wire 311. The wire is shown to be very long so that there are many options for connection from outside the cell. As shown in FIG. 2, the formed input conductor 252 for receiving the MUX input selector signal $S_0$ 152 is a gate strap or gate connection point connecting to both the gate layer terminal of p-channel type VTFET device labeled P1 and to the gate layer terminal of n-channel type VTFET device labeled N1 and is not an external wire. As further shown in the top down view of FIG. 2, a formed input conductor structure 205 is shown receiving the input MUX signal B and is a gate strap or gate connection to both the gate layer terminal of p-channel type VTFET device labeled P2 and to the gate layer terminal of n-channel type VTFET device labeled N2. Similarly, a formed input conductor structure 209 is shown receiving the input MUX signal A and connects to both the gate layer terminal of p-channel type VTFET device labeled P4 and to the gate layer terminal of n-channel type VTFET device labeled N4. Further, a formed input gate contact structure 219 is shown as a gate strap or gate connection for connecting to both the gate layer terminal of p-channel type VTFET device labeled P3 and to the gate layer terminal of n-channel type VTFET device labeled N3. This conductive gate contact structure 219 receives the inverse MUX selector signal ~$S_0$ from the output of the input inverter circuit structure 202.

Further shown in the top down view of FIG. 2, is a formed conductor contact structure 242 for sourcing or receiving a signal at one of the VTFET devices of the inverter device 202. Further shown in the top down view of FIG. 2, the formed contact conductor structure 243 connects to a top drain (or source) layer terminal of the other VTFET device of the inverter device 202 for providing the inverse MUX selector signal ~$S_0$ to other components of the MUX device structure 210.

Further shown in the top down view of FIG. 2, a formed contact conductor structure 233 connects the source (or drain) layer terminal of n-channel VTFET device labeled N2 to the drain (or source) layer terminal of n-channel VTFET device labeled N1 and corresponds to conductor 133 shown in FIG. 9D. Further shown in the top down view of FIG. 2, a formed contact conductor structure 234 connects the source (or drain) layer terminal of n-channel VTFET device labeled N3 to the drain (or source) layer terminal of n-channel VTFET device labeled N4 and corresponds to conductor 134 shown in FIG. 9D.

As further shown in the top down view of FIG. 2, a formed top contact conductor structure 215 labeled C0 is formed that connects the top source (or top drain) layer terminals of each p-channel type VTFET devices labeled P1 and P2 to the top source (or top drain) layer terminal of both p-channel type VTFET devices labeled P3 and P4 and corresponds to the conductor 115 of FIG. 9D. In an embodiment, contact conductor structure 215 is formed during middle-of-line (MOL) processes. Similarly, there is formed a bottom contact conductor structure 235 labeled C0 for connecting signals from both the bottom source (or bottom drain) layer terminals of each n-channel type VTFET devices labeled N2 and N3 to the input terminal comprising an input conductor 272 of the output inverter device 262 which input conductor 272 corresponds to a gate strap or gate connection conductor line 172 at the input to the output inverter 162 as shown in FIG. 9D. As further shown in FIG. 2, the bottom contact conductor structure 235 labeled C0 further connects to region 236 which is further connected to bottom source (or bottom drain) region 216 common to both VTFETs P3, P4 such that the bottom source (or bottom drain) region 216 common to both VTFETs P3, P4 connects to bottom drain (or bottom source region 224 common to both VTFETs N3, N4, respectively. That is, regions 216, 236, 224 are all connected. The contact structure 235 bridges across the N-P boundary to connect 224 and 236. Regions 216 and 236 are physically connected but due to doping the additional contact is needed to get electrical connection that ties together VTFET devices P3, P4, N2, and N3. Further shown in the top down view of FIG. 2, a formed contact conductor structure 273 connects a top source (or top drain) layer terminals of the VTFET devices forming output inverter 262. Further shown in the top down view of FIG. 2, a formed contact conductor structure 274 connects the top source (or top drain) layer terminal of further VTFET devices forming output inverter 262.

According to flexible MOL processing embodiments herein, an intermediate level metal wiring connection labeled C1-1 301 is formed to connect an output conductor providing output inverse selector signal ~$S_0$ 153 of the input inverter device structure 202 to the gate contact structure 219 connecting both the gate layer terminal of p-channel type VTFET device labeled P3 and to the gate layer terminal of n-channel type VTFET device labeled N3 that receive inverted selector signal ~$S_0$ 153.

Figure 3:
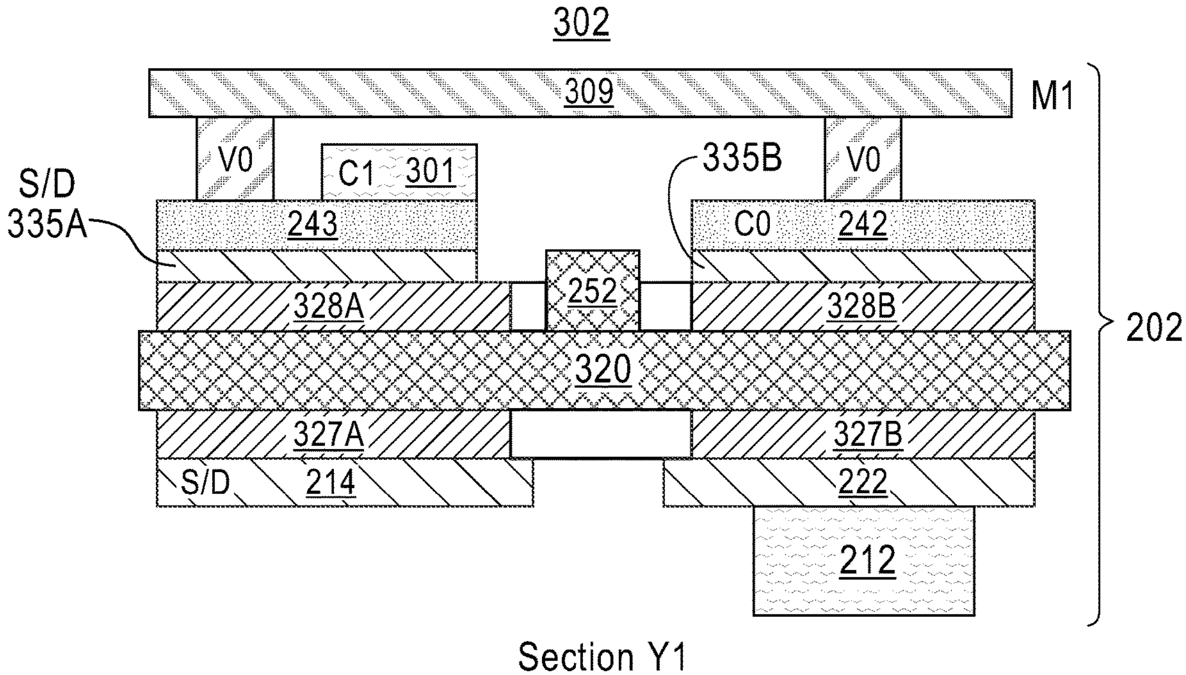
FIG. 3 illustrates and elevation cross-sectional view of a portion of the semiconductor MUX circuit taken along line Y1-Y1 of the semiconductor MUX circuit structure of FIG. 2.

Further, in accordance with flexible MOL processing embodiments herein, a further intermediate level metal wiring connection labeled C1-2 351 is formed to connect bottom contact conductor structure 235 connecting the bottom source (or bottom drain) layer terminals of each n-channel type VTFET devices labeled N2 and N3 to the input conductor 272 of the output inverter device 262 and corresponds to conductor line 172 at the input to the output inverter 162 as shown in FIG. 9D Referring now to FIG. 3, there is depicted a simplified cross-sectional elevational view of the MUX device input inverter structure 202 taken along line Y1-Y1 of the MUX device circuit 200 depicted in the top-down view of FIG. 2. As shown in FIG. 3, the simplified cross-sectional elevational view of the MUX device inverter structure 302 depicts two interconnected VTFET devices of the input inverter 202, each device depicted as a vertical stack including, from bottom to top: a bottom source (or bottom drain) layer 214, 222, a bottom spacer structure 327A, 327B formed thereon, a vertical oriented metal gate structure 320 that is commonly connected to the gate layers forming both VTFET devices of input inverter structure 202, and respective top spacer structures 328A, 328B formed thereon, an epitaxially grown top drain (or top source) layer 335A, 335B. It is understood that each VTFET device includes a respective semiconductor channel layer (not shown) that extends vertically between the respective top drain (or top source) and bottom source (or bottom drain) layers that form a fin structure. Positioned around the fin structure is a gate dielectric layer (not shown) that is in direct contact with the vertical channel layer and the gate dielectric layer is surrounded by the vertical metal gate structure 320. This channel region becomes conductive with carriers when the VTFET is turned on. Formed on top of top drain (or top source) layer 335A is the formed conductor contact structure 242 and formed on top of top drain (or top source) layer 335B is the formed output conductor 243. Using MOL damascene and subtractive etch process techniques, the intermediate level metal wiring connection labeled C1-1 301 is formed on top of output conductor 243 to connect the output inverse selector signal ~$S_0$ 153 of the input inverter device structure 202 to the conductive contact structure 219 connecting both the gate layer terminal of p-channel type VTFET device labeled P3 and to the gate layer terminal of n-channel type VTFET device labeled N3 that receive inverted selector signal ~$S_0$ 153 at the MUX device structure 210. As further shown in FIG. 3, using BEOL processing techniques, there is formed respective via conductors labeled V0 on each of formed conductors 242, 243 that enable connection to a first metal line 309 of a first metallization level M1.

Figure 4:
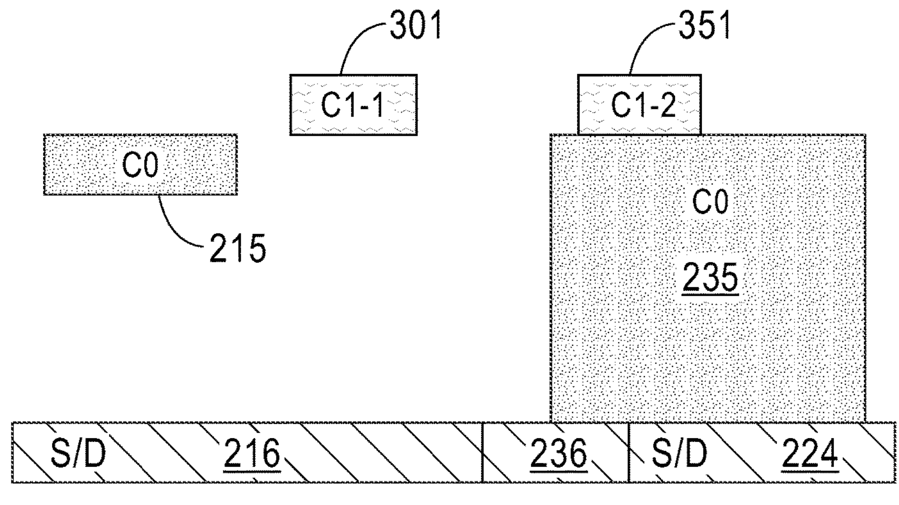
FIG. 4 illustrates and elevation cross-sectional view of a portion of the semiconductor MUX circuit taken along line Y2-Y2 of the semiconductor MUX circuit structure of FIG. 2.

Referring now to FIG. 4, there is depicted a simplified cross-sectional elevational view of a portion of the MUX device structure 210 taken along line Y2-Y2 in the top-down view of FIG. 2. As shown in FIG. 4, the simplified cross-sectional elevational view of the MUX device portion depicts the intermediate level metal wiring connection labeled C1-1 301 formed using MOL damascene and subtractive etch process techniques that extends from the output conductor 243 as shown in FIG. 3 to carry output inverse selector signal ~$S_0$ 153 of the input inverter device structure 202 to gate contact structure 219. FIG. 4 further depicts the intermediate level metal wiring connection labeled C1-2 351 that connects to the conductor structure 235 connecting the bottom source (or bottom drain) layer terminal 224 of each n-channel type VTFET devices labeled N2 and N3 as shown in FIG. 2 and that extends from the contact conductor structure 235 and includes a metal wiring connection portion 352 for connection to input conductor 272 of output inverter 262.

Figure 5:
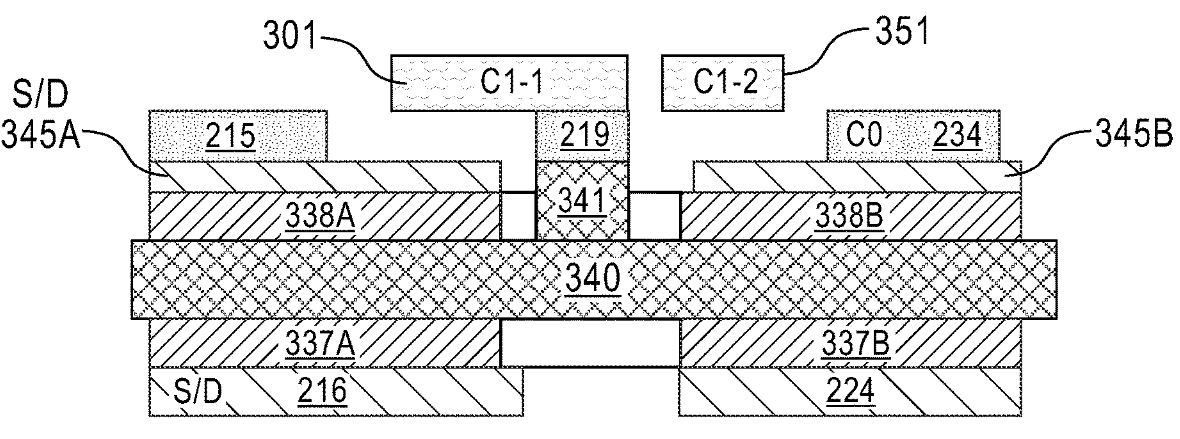
FIG. 5 illustrates and elevation cross-sectional view of a portion of the semiconductor MUX circuit taken along line Y3-Y3 of the semiconductor MUX circuit structure of FIG. 2.

Referring now to FIG. 5, there is depicted a simplified cross-sectional elevational view of a portion of the MUX device structure 210 taken along line Y3-Y3 in the top-down view of FIG. 2. As shown in FIG. 5, the simplified cross-sectional elevational view of the MUX device structure portion depicts two VTFET devices P3 and N3 of the MUX device structure 210 each device having a gate layer terminal connecting to the common gate contact structure 219 receiving the inverse selector signal ~$S_0$ 153 via intermediate level metal wiring connection C1-1 301. Each VTFET device P3 and N3 device is depicted as a respective vertical stack including, from bottom to top: a bottom source (or bottom drain) layer 216, 224, a bottom spacer structure 337A, 337B formed thereon, a vertical oriented metal gate structure 340 that is common to the both gate terminals of both VTFET devices P3 and N3 and including an extension 341 upon which is formed the gate terminal contact structure 219, a respective top spacer structure 338A, 338B, and respective epitaxially grown top drain (or top source) layers 345A, 345B formed thereon. It is understood that each VTFET device includes a respective semiconductor channel layer (not shown) that extends vertically between the respective top drain (or top source) and bottom source (or bottom drain) layers that form a fin structure. Positioned around the fin structure is a gate dielectric layer (not shown) that is in direct contact with the vertical channel layer and the gate dielectric layer is surrounded by the vertical metal gate structure 340. This channel region becomes conductive with carriers when the VTFET is turned on. Formed on top of top drain (or top source) layer 345A is the formed intermediate level wiring connection labeled C1-1 301 and formed on top of top drain (or top source) layer 345B is the formed conductor contact structure 234 labeled C0. In the simplified cross-sectional elevational view of FIG. 5 showing the MUX device portion taken along line Y3-Y3 of FIG. 2, the intermediate level wiring connection labeled C1-1 301 is formed using MOL damascene and subtractive etch process techniques and extends from the output conductor contact 243 as shown in FIG. 3 to carry output inverse selector signal ~$S_0$ 153 of the input inverter device structure 202 to gate contact structure 219. FIG. 5 further depicts the intermediate level wiring connection labeled C1-2 351 also formed using MOL damascene and subtractive etch process techniques that connects to the conductor contact structure 235 connecting the bottom source (or bottom drain) layer terminal 224 of each n-channel type VTFET devices labeled N2 and N3 as shown in FIG. 2 and that extends from the contact conductor contact structure 235 for connection to input conductor 272 of output inverter 262.

Figure 6:
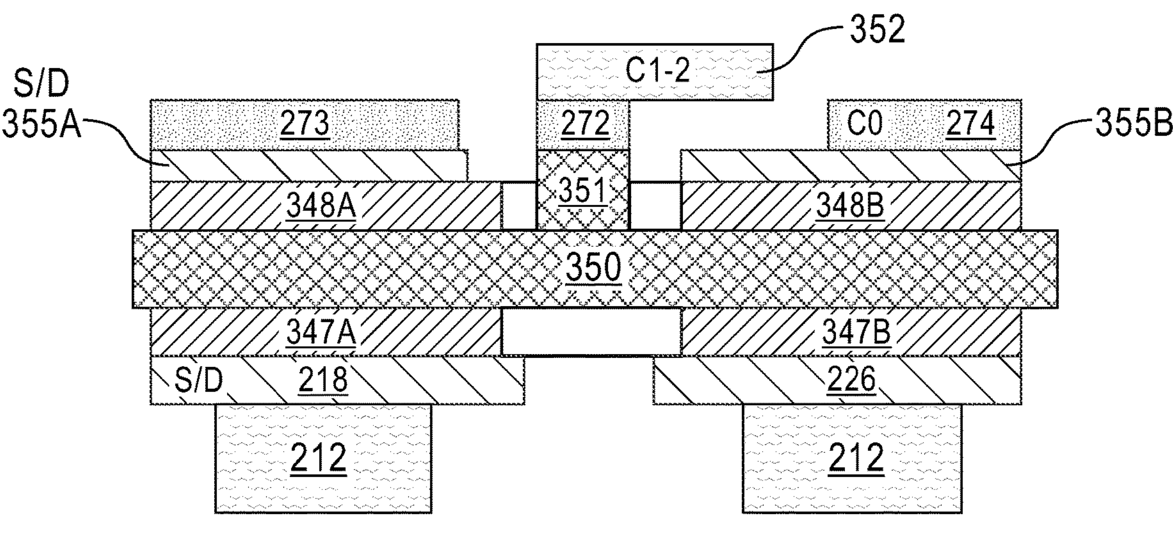
FIG. 6 illustrates and elevation cross-sectional view of a portion of the semiconductor MUX circuit taken along line Y4-Y4 of the semiconductor MUX circuit structure of FIG. 2.

Referring now to FIG. 6, there is depicted a simplified cross-sectional elevational view of a portion of the MUX device output inverter 262 taken along line Y4-Y4 in the top-down view of FIG. 2. As shown in FIG. 6, the simplified cross-sectional elevational view of the MUX device output inverter 262 depicts two VTFET devices of the paired VTFET devices 264 and 266, each device having a vertical oriented metal gate layer 350 connecting to the input conductor 272 receiving the signal sourced from the conductor contact structure 235 connecting the bottom source (or bottom drain) layer terminal 224 of each n-channel type VTFET devices labeled N2 and N3 as shown in FIG. 2 via intermediate level metal wiring connection labeled C1-2 351 and intermediate level metal wiring connection portion 352. Each VTFET device of the paired VTFET devices 266 and 264 is depicted as a respective vertical stack including, from bottom to top: a bottom source (or bottom drain) layer 218, 226, a bottom spacer structure 347A, 347B formed thereon, a vertical oriented metal gate layer 350 that is common to the both gate terminals of both VTFET devices and including an extension 351 upon which is formed the gate terminal contact structure 272, a top spacer structure 348A, 348B, and respective epitaxially grown top drain (or top source) layers 355A, 355B formed thereon. It is understood that each VTFET device includes a respective semiconductor channel layer (not shown) that extends vertically between the respective top drain (or top source) and bottom source (or bottom drain) layers that form a fin structure. Positioned around the fin structure is a gate dielectric layer (not shown) that is in direct contact with the vertical channel layer and the gate dielectric layer is surrounded by the vertical oriented metal gate layer 350. This channel region becomes conductive with carriers when the VTFET is turned on. Formed on top of top drain (or top source) layer 355A is the formed contact conductor structure 273 and formed on top of top drain (or top source) layer 355B is the formed conductor contact structure 274. As shown in FIG. 6, the simplified cross-sectional elevational view of the MUX output inverter device portion taken along line Y4-Y4 of FIG. 2 further depicts the intermediate level wiring connection portion labeled C1-2 352 that is formed using MOL damascene and subtractive etch process techniques and that connects to the conductor contact structure 235 connecting the bottom source (or bottom drain) layer terminal 224 of each n-channel type VTFET devices labeled N2 and N3 as shown in FIG. 2 and that extends from the contact conductor contact structure 235 for connection to input conductor structure 272 of semiconductor output inverter 262.

Figure 7:
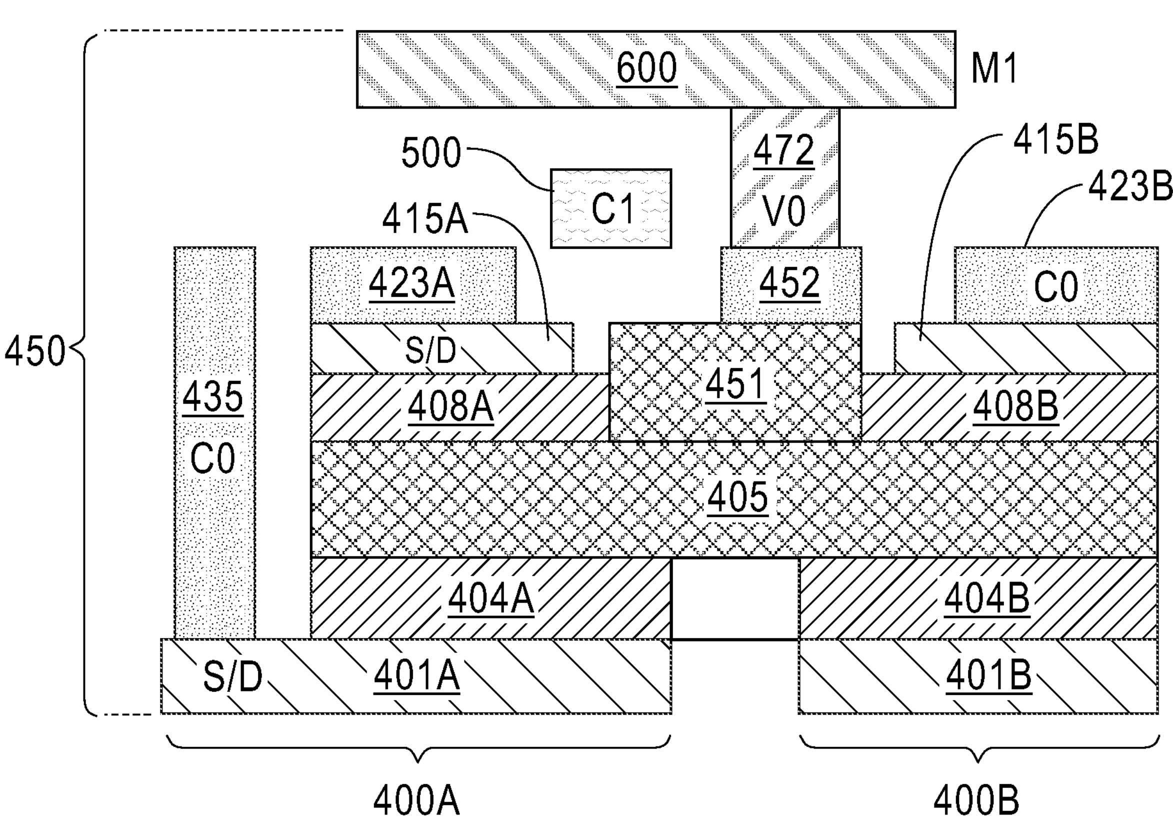
FIG. 7 depicts a simplified cross-sectional elevational view of a semiconductor logic circuit that includes two connected VTFET devices formed using a conventional Front-End-Of-Line (FEOL) vertical transistor process flow.

Referring now to FIG. 7, there is depicted a simplified cross-sectional elevational view of a semiconductor logic circuit 400 that includes two connected VTFET devices 400A, 400B formed using a conventional FEOL vertical transistor process flow. These VTFET devices 400A, 400B can be interconnected to form any logic circuit device, e.g., inverter, Multiplexor, AND gate, NAND gate, OR gate, NOR gate, XOR gate, XNOR gate, etc. or can be an interconnection of several such devices. As shown in FIG. 7, the simplified cross-sectional elevational view of connected VTFET devices 400A, 400B of logic circuit 400 is depicted as a respective vertical stack formed on a semiconductor material substrate (not shown) and including, from bottom to top: a bottom source (or bottom drain) layer 401A, 401B of a particular type conductivity doping, a bottom spacer structure 404A, 404B formed thereon, a vertical oriented metal gate structure 405 that is common to the both gate terminals of both VTFET devices and that includes an extension 451 upon which is formed a first level gate contact structure 452. The respective bottom spacer structures 404A, 404B isolate the vertical oriented metal gate structure 405 from the respective bottom source (or bottom drain) layers 401A, 401B. Formed a top the vertical oriented metal gate structure 405 is respective spacer structures 408A, 408B, and respective epitaxially grown top drain (or top source) layers 415A, 415B of the particular conductivity type doping formed thereon. The respective top spacer structures 408A, 408B isolate the vertical oriented metal gate structure 405 from the respective top drain (or top source) layers 415A, 415B. It is understood that each VTFET device includes a respective semiconductor channel layer (not shown) that extends vertically between the respective top drain (or top source) and bottom source (or bottom drain) layers that form a fin structure. Positioned around the fin structure is a gate dielectric layer (not shown) that is in direct contact with the vertical channel layer and the gate dielectric layer is surrounded by the vertical oriented metal gate structure 405. It is understood that each drain and source region of a VTFET will include common conductivity type, e.g., p-type or n-type conductivity, as known in the art thereby rendering a VTFET as either a p-type or n-type. The source and drain regions of the fin structure are the portions of the fin structure that are on opposing sides of the channel region of the fin structure and are electrically separated from the gate by the respective spacer structures. The channel region can be vertical semiconductor nanosheet that becomes electrically conductive with drain/source carriers of the corresponding conductivity type when the VTFET is turned on and suitably biased. As further shown in FIG. 7, the structure further includes an interlevel dielectric material layer 450 on the VTFET logic circuit structures that may be composed of an oxide, nitride or oxynitride material. In embodiments, interlevel dielectric material can be a low-k dielectric material such as an oxide dielectric material or a silicon doped oxide (e.g., SiCOH, SICNH) and can include porous silicates, carbon doped oxides, silicon dioxides, silicon oxynitrides, carbon-doped silicon oxide (SiCOH) and porous variants thereof, silsesquioxanes, siloxanes, or other dielectric materials having, for example, a dielectric constant in the range of about 2 to about 4. An SiCOH dielectric film having a dielectric constant (k) of about 2.7-2.8 can, for example, comprise one or more ILD layers. Such a dielectric film can be deposited using a deposition process, e.g., chemical vapor deposition, plasma enhanced chemical vapor deposition, etc.

Using MOL single damascene or dual damascene processes, there is formed several first level contact structures including a first level contact structure 435 formed on top of bottom source (or drain) layer 401A. First level contact structure 435 can be composed of a metal or metal nitride material and is formed using photolithographic damascene, etching and deposition processes known in the art. MOL first level contact structure is of a vertical height extending to or above the top drain (or top source) layer 415A and extension 451. Further, there is formed on top of drain (or top source) layer 415A, a first level metal or metal nitride contact structure 423A and formed on top of top drain (or top source) layer 415B is also formed a first level metal or metal nitride contact structure 423B. A further first level metal or metal nitride first level gate contact structure 452 is formed to connects to the extension 451 of the first and second VTFETs 400A, 400B.

Then, in subsequent BEOL processes, there can be additionally formed first level contact via structures and electrically connecting metal line structures for communicating signals to and from the VTFET devices. As shown in FIG. 7, for example, formed on top and electrically connecting first level gate contact structure 452 is a first level via structure (V0) 472 and formed on top of first level via structure 472 is a first metallization (M1) conductor structure, e.g., metal wire 600.

However, in accordance with embodiments herein, MOL processes include the forming of a further or second level metal contact structure(s) 500 that provides a contact level above the first contact level structures 435, 423A, 423B. For example, this MOL formed second level metal contact structure(s) 500 is a contact structure(s) that is(are) formed over the gate and without contacting the gate and is additionally situated below the M1 metallization level embodied as conductive metal wire 600 shown in FIG. 7. In an embodiment, first level gate contact structure 452 can electrically connect to a metal wire 600 at the M1 metallization level, however second level metal contact structure (C1) 500 is not electrically connected to the metal wire 600 at the M1 metallization level. The second level metal contact structure (C1) 500 can electrically connect to first level metal contact (C0). Further, the provision of second level contact in addition to the first level contact enables the completion of cross-couple VTFET device connections at contact level as demonstrated in the MUX device structure 210 shown in FIG. 2.

Figure 8:
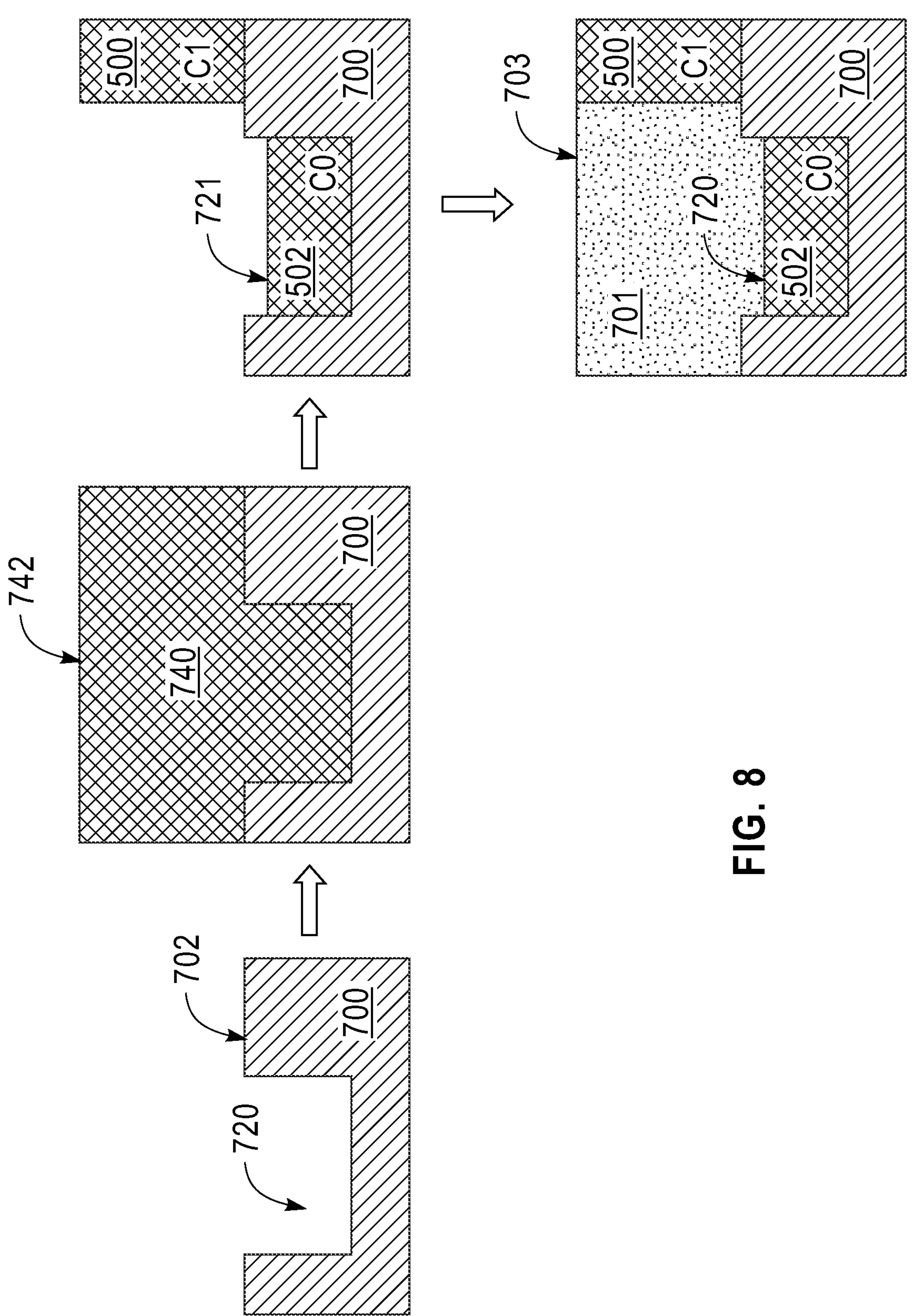
FIG. 8 depicts MOL damascene and subtractive etch processes employed to respectively form both the first level metal contact (C0) and second level metal contact structure (s) (C1) according to an embodiment of the invention.

In embodiments, in view of FIG. 8, MOL damascene and subtractive etch processes are employed to respectively form both the first level metal contact (C0) and second level metal contact structure(s) (C1) according to an embodiment of the invention. In particular, as shown in FIG. 8, as part of MOL processes, a damascene method is employed to form a first level contact structure. In the MOL damascene method there is provided a first lithographic photoresist patterning of a channel into the ILD layer 700 including a photoresist mask deposition, exposure and development. Then, the resist mask pattern is transferred into the underlying ILD layer 700 via a single etch or multiple etches to provide a resulting trench pattern 720 corresponding to a desired contact structure as illustrated in FIG. 8. The etch or multiple etches can include a dry etch process, a chemical wet etch process, or any combination thereof. When a dry etch is used, the dry etch can be a reactive ion etch process, a plasma etch process, ion beam etching or laser ablation. The patterned photoresist material can be removed anytime after transferring the trench pattern into the ILD layer 700 utilizing a conventional stripping process. Then, as shown in FIG. 8, a metal material that can be used in the damascene process such as Ru, W, Co, Ta, TaN, Ti, TiN is deposited to overfill 740 the defined trench(es) (and any other formed metallization features). As shown in FIG. 8, the metal material overfill 740 extends vertically beyond the surface 702 of the ILD layer 700 and extends laterally beyond the edges of the defined trench. Such damascene metal material deposition overfill 740 may include forming damascene metal material seed layer and then damascene metal material deposition steps (e.g., CVD, PVD+ reflow processes and fills the trench(es). It is understood that the damascene metal overfill 740 can be formed of an etchable metal material such as Mo, Ru, W, Al, TiN or any other metal material that can be removed by plasma reactive ion etching (RIE).

As shown in FIG. 8, the damascene metal overfill 740 is subject to a subsequent chemical-mechanical-planarization (CMP) step to planarize a surface 742 of the metal overfill. Then, the second metal contact level structure is formed below the M1 metal level by conventional subtractive metal etching processes. In an embodiment, a resist mask is formed above the metal overfill 740 which is structured in photolithography. An anisotropic subtractive metal etch is then performed to remove a portion of the overfilled metal material (overfill 740) including an etch back portion 721 into the trench 720 that leaves a remaining metal material portion forming the first level metal contact structure (C0) 502. Any portion of the overfilled metal material (overfill 740) that is not removed and remains above the surface 702 of the ILD layer 700 forms the second level metal contact structure(s) (C1) 500. In an embodiment, the second level metal contact structure (C1) 500 is shown above and isolated from the first level metal contact structure (C0) 502 and are not electrically connected.

As further shown in FIG. 8, a subsequent process step includes the depositing of a second inter-level dielectric material 701 above the first ILD material layer 700 and planarizing the top surface 703 thereof so as to become co-planar with a surface of the second level metal contact structure (C1) 500. Thus, ILD layers 700, 701 form a dielectric material “stack”, with the first level conductive contact structure formed using a damascene or dual damascene process in the first level 700 of the ILD stack and the second level conductive contact structure formed using a subtractive metal etch process in the second level 701 of the ILD material stack after the damascene or dual damascene process. The second level metal contact structure C1 500 provides a contact level above the first contact level structure 502 and below any first level metallization metal wire 600 (as shown in FIG. 7) that is formed during subsequent BEOL processes.

In a further embodiment, although not shown in view of FIG. 8, the anisotropic metal etch that is performed into the trench 720 can be performed in a manner that leaves the second level metal contact structure(s) (C1) 500 in electrical contact with the first level contact structure (C0) 502 and below any first level metallization metal wire 600.

In further processing steps, after BEOL processing used to form any first level and subsequent level metallization wiring, the wafer can be flopped and bonded to remove any underlying substrate to expose the FEOL bottom layers of the semiconductor circuits. Then, further processes can include forming contacts to bottom source/drain regions and any further backside BEOL structures.

FIG. 8 thus highlight method steps for forming two-level MOL contact connector structures below first metallization level wiring formed during BEOL processing according to embodiments of the present invention. These highlighted steps result in semiconductor device structures that include MOL contact connector structures formed at two levels using damascene and subtractive metal etch techniques. The provision of MOL level contact connections using damascene coupled with subtractive etch process steps increases circuit design flexibility. That is, as scaling cell area of semiconductor logic circuits is very difficult, especially for MUX layouts due to wiring access, the flexible MOL cross-connections made below M1 metallization level provides for much improved M1 and M2 wirability.

While FIGS. 2-8 illustratively demonstrates exemplary structures and processing steps, according to specific embodiments of the present invention, it is clear that a person ordinarily skilled in the art can readily modify such structures or process steps for adaptation to specific application requirements, consistent with the above descriptions.

It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. An integrated circuit (IC) device comprising:

a logic circuit comprising at least two formed Vertical Transport Field Effect Transistor (VTFET) devices, each VTFET device having corresponding a source region, a drain region, and a gate region;

an inter-level dielectric material stack formed above terminals corresponding to each region of the at least two VTFET devices;

a first metallization level including a first level metal line above the at least two VTFET devices;

a first level conductive contact structure formed at a first level within said inter-level dielectric material stack below the first level metal line and having a first end contacting one of: the source region, the drain region, or the gate region of a first VTFET device, the first level conductive contact structure having a second end connecting to one of: a source region, a drain region, or a gate region of a second of the VTFET device of the logic circuit; and a second level conductive contact structure formed at a second level within said inter-level dielectric material stack below the first level metal line, a top surface of the second level conductive contact structure being below a bottom surface of the first level metal line and not touching the bottom surface of the first level metal line, and the second level conductive contact structure having at least one end directly contacting the first level conductive contact structure, wherein the second level conductive contact structure is disposed above the first level conductive contact structure.

2. The integrated circuit (IC) device as claimed in claim 1, wherein said second level conductive contact structure comprises a second end connecting to one of: a source region, a drain region, or a gate region of a further VTFET device of the logic circuit.

3. The integrated circuit (IC) device as claimed in claim 2, wherein the first level conductive contact structure and second level conductive contact structure are of the same metal material.

4. The integrated circuit (IC) device as claimed in claim 2, further comprising a via contact connection further connecting the first level conductive contact structure to a metallization line conductor of the first metallization level formed using a Back-end-of-line (BEOL) process.

5. The integrated circuit (IC) device as claimed in claim 2, wherein the first level conductive contact structure and second level conductive contact structure are metallized at the same time.

6. The integrated circuit (IC) device as claimed in claim 5, wherein during the MOL device processing flow, the first level conductive contact structure is formed using a damascene or dual damascene process in the first level of said inter-level dielectric material stack.

7. The integrated circuit (IC) device as claimed in claim 5, wherein during the MOL device processing flow, the second level conductive contact structure is formed using a subtractive metal etch process in the second level of said inter-level dielectric material stack after the damascene or dual damascene process.

8. The integrated circuit (IC) device as claimed in claim 1, wherein the logic circuit comprising the at least two formed VTFET devices comprises one or a combination of: an inverter, a Multiplexor, an AND gate, a NAND gate, an OR gate, a NOR gate, an XOR gate, an XNOR gate.

* * * * *